United States Patent [19]
Brown

[11] Patent Number: 5,894,522
[45] Date of Patent: Apr. 13, 1999

[54] DISTORTION REDUCTION SYSTEM

[75] Inventor: David A. Brown, Indianapolis, Ind.

[73] Assignee: Lucent Technologies Inc., Murray Hill, N.J.

[21] Appl. No.: 08/778,121

[22] Filed: Jan. 2, 1997

Related U.S. Application Data

[60] Provisional application No.60/017,862, May 8, 1996.

[51] Int. Cl.⁶ .............................. H03G 3/00; H04B 15/00
[52] U.S. Cl. ...................... 381/94.8; 381/107; 330/284
[58] Field of Search ................... 330/284, 10; 381/120, 381/978, 107

[56] References Cited

U.S. PATENT DOCUMENTS

| | | |
|---|---|---|
| 4,199,723 | 4/1980 | Cummings et al. . |
| 4,605,910 | 8/1986 | Covill . |
| 4,689,819 | 8/1987 | Killion .................................. 381/68.4 |
| 4,737,731 | 4/1988 | Swanson et al. . |

Primary Examiner—Forester W. Isen

[57] ABSTRACT

A distortion reduction system for an audio device having first and second power supply voltages, a driver circuit for amplifying an audio signal, and, a speaker for outputting the amplified audio signal, allows a speaker driver system to increase significantly its average acoustic output power without appreciably degrading the audio signal quality. The system performs this function independently of the power supply voltage value by detecting a voltage difference between instantaneous peak amplified audio signal value and each first and second power supply voltage values and, providing a first gain control signal to the driver circuit when the detected difference is greater than a predetermined trigger level value, and a second gain control signal to the driver circuit when the detected difference is less than the predetermined trigger level value. In this system, the first and second gain control signals operate to maximally maintain the amplified peak-to-peak audio signal values between power supply voltage limit values and prevent onset of audio signal distortion while maximizing the average RMS value.

11 Claims, 2 Drawing Sheets

5,894,522

1

DISTORTION REDUCTION SYSTEM

RELATED APPLICATIONS

This application claims the benefit of provisional U.S. patent application Ser. No. 60/017,862, filed May 8, 1996, now abandoned.

FIELD OF INVENTION

The present invention relates generally to audio systems employing speaker drivers and more particularly, to a system for reducing distortion in audio systems regardless of the system's voltage or current requirements.

BACKGROUND OF THE INVENTION

There are many audio products on the market today that are voltage supply limited, i.e., operate with a fixed voltage supply source. For example, both far and near can there be found battery powered audio products such as portable radios, tape and CD-players, "Boom Boxes", SONY Walkman®, etc. It is desirable for all such audio products, whether portable or not, to produce a low distortion acoustic output that is sufficient to be heard by the listener regardless of the volume and power levels. However, inherent technical problems exist in achieving low distortion output power of audio equipment because of the following reasons: 1) electrical power into a speaker is determined by the relation $V_{rms}^2/R_{speaker}$, i.e., the root mean square voltage supplied to the speaker divided by the speaker impedance. As $V_{rms}$ is limited, then the acoustic output power is limited. The maximum low distortion sin wave that can be applied to a speaker from an electrical source having voltage supply V+ and V− is a peak-to-peak value equal to the voltage supply. Although the maximum rms output value can be higher, it will have a significantly higher value of total harmonic distortion (THD); and, 2) most audio signals have a wide dynamic range and in the case of music, the ratio of maximum audio signal amplitude to average audio signal amplitude may be 2:1 to 10:1 or greater. In order to avoid distortion, the gain of the system must be maintained at a level where the maximum signal will not distort when it runs out of voltage. A consequence of reducing the gain is that the average audio signal amplitude is reduced by a significant amount.

Currently, Automatic Gain Control (AGC) circuitry has been implemented in audio systems to reduce the effect of distortion by monitoring only the output audio signal amplitude and dynamically reducing the signal amplitude if the output audio signal amplitude exceeds a predetermined AGC (voltage or current) trigger level. A drawback of the AGC implementation is that it prevents the audio signal of interest from exceeding a fixed amplitude level and additionally, reduces average audio signal amplitude.

It would thus be highly desirable to provide an audio system having the capability of producing a maximum low distortion acoustic power for audio signals without reducing average audio signal amplitude.

Moreover, it would thus be highly desirable to provide the capability of producing a maximum low distortion acoustic power for audio signals in an audio system having limited voltage supply.

SUMMARY OF THE INVENTION

The distortion reduction system of the invention operates to detect the onset of audio signal distortion conditions as peak-to-peak audio passages approach the voltage supply limits (or "rails") and dynamically reduces audio signal gain to prevent the distortion from occurring. This has the effect of allowing the average audio signal amplitude and thereby listening level to be increased to the maximum allowed by the power supply of the system without introducing a significant amount of distortion to the signal of interest.

Moreover, distortion reduction system of the invention maximizes the RMS audio output level of a speaker driver electrical design while limiting the Total Harmonic Distortion when used with any voltage supply level.

Advantageously, the distortion reduction system of the invention monitors the proximity of the audio output signal to the power supply rail voltages and reduces the signal gain when the two levels are below a predetermined value. This has the effect of only becoming active when it is needed to prevent distortion. If the power supply is increased, the output can increase proportionately before the distortion reduction system is activated and the signal gain is changed.

BRIEF DESCRIPTION OF THE DRAWINGS

The features of the present invention are set forth with particularity in the appended claims. The present invention, both as to its organization and manner of operation, together with further objects and advantages thereof, may best be understood by reference to the following description, taken in conjunction with the accompanying drawings in which:

DETAILED DESCRIPTION OF THE PREFERRED EMBODIMENTS

Figure 1:
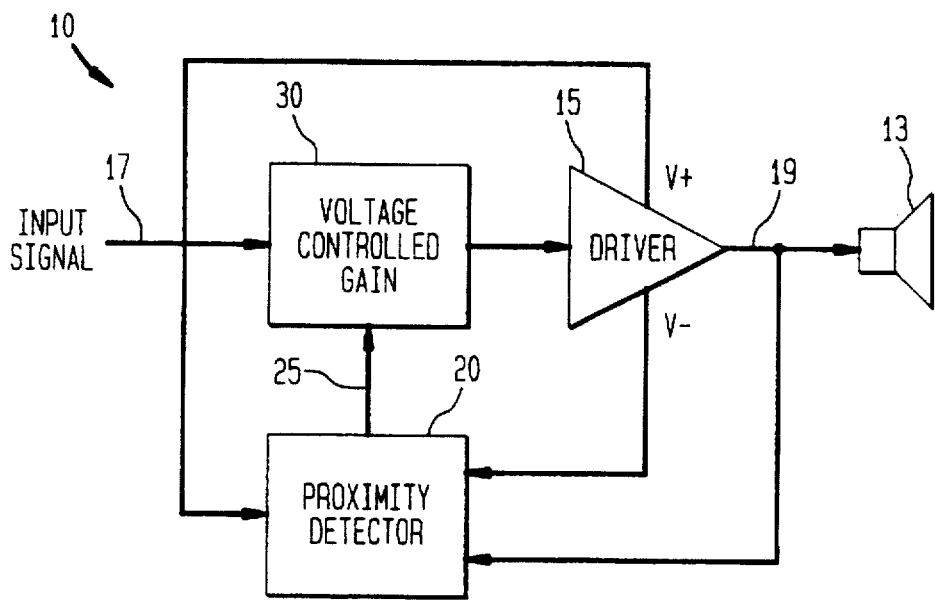
FIG. 1 is a system diagram of a distortion reduction system application.

FIG. 1 is a general block diagram of an audio speaker driver circuit employing the distortion reduction system 10 of the invention. As illustrated in FIG. 1, the audio speaker driver circuit receives input audio signal 17 and includes a speaker 13, a speaker driver 15 for amplifying input audio signal 17 and driving the speaker 13 with an output amplified audio signal 19. The driver 15 comprises a gain amplifier that is shown in FIG. 1 as being supplied with both a positive power supply voltage $V^+$ and a negative power supply voltage $V^-$. The actual values of these power supply voltages is not critical, as the distortion reduction system 10 is intended to work with all types of audio systems regardless of the power supply requirements.

As shown in FIG. 1, the distortion reduction system 10 is composed of two primary devices, a proximity detector 20 and a voltage (or current) controlled gain circuit 30. The proximity detector 20 requires three inputs: the positive power supply voltage $V^+$, the negative power supply voltage $V^-$, and the speaker output signal 19 and its operation is governed by the following algorithm:

if: the positive power supply rail voltage $V^+ - V_{speaker} <$ trigger value or, if: $V_{speaker} - V^- <$ trigger value, then reduce gain.

Specifically, the proximity detector 20 detects proximity of the audio output signal 19 to the voltage supply rails $V^+$, $V^-$, and outputs a control signal 25 to control the function of the voltage gain controller 30 which, in normal operation, provides a gain sufficient to maintain maximum levels of distortionless audio output at speaker 13, and which functions to decrease system gain when the speaker drive amplitude level exceeds the predetermined trigger level. The system reduces gain by applying the appropriate polarity voltage change to the voltage controlled gain circuit 30 which will continue to change that voltage until the above algorithm is not satisfied.

Figure 2:
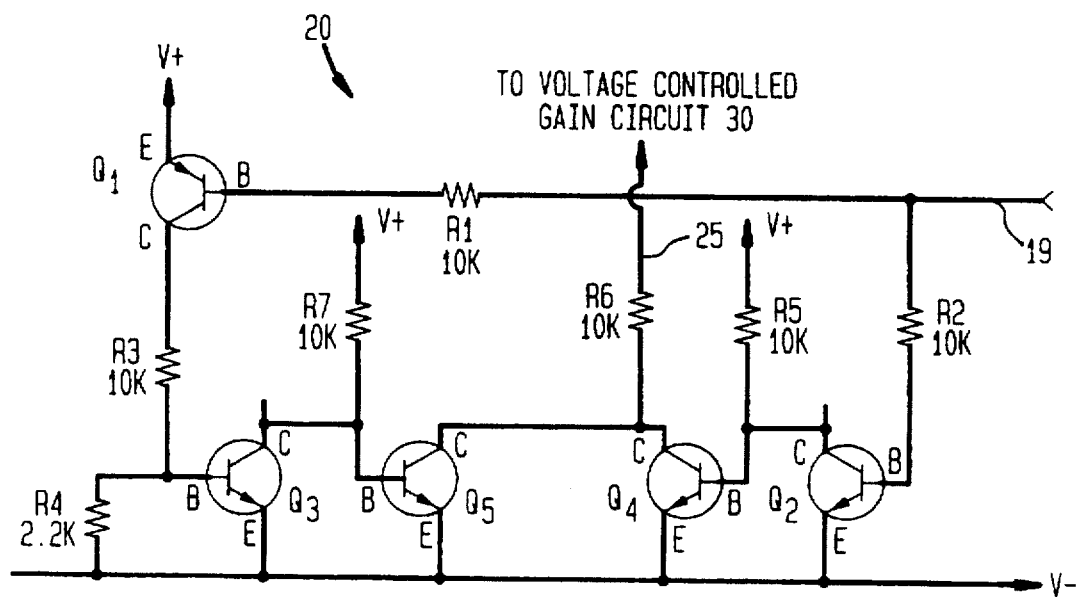
FIG. 2 illustrates a detailed circuit diagram of the proximity detector circuit.

FIG. 2 illustrates a detailed circuit diagram of a non-limiting example embodiment of the proximity detector circuit 20. As shown in FIG. 2, the proximity detector circuit 20 receives the positive power supply voltage $V^+$ connected at the emitter of Q1, a PNP bipolar transistor, and receives the negative power supply voltage $V^-$ at the emitter of NPN bipolar transistors Q2–Q5. In the example embodiment of FIG. 2, the negative power supply voltage $V^-$ is considered ground, however the proximity detector circuit may be configured to accommodate positive and negative supply voltages.

As shown in FIG. 2, the speaker driver signal 19 is fed back to the proximity detector 20, and is input through resistor R1 to the base terminal of transistor Q1 and through resistor R2 to the base terminal of transistor Q2. In normal operation with non-distortion audio output, the speaker driver output amplitude level averages in between the voltage supply rails $V^+$, $V^-$, which will normally maintain transistors Q1 and Q2 turned on. Specifically, with Q2 turned on, its collector is shorted to the value of the negative voltage rail $V^-$, which effectively turns off transistor Q4 and renders control signal line 25 at the common collectors of transistors Q4 and Q5 in the high-impedance state thus, maintaining the voltage gain of the controller 30 at its current state to produce a distortionless audio signal. Likewise, with Q1 turned on, its collector is shorted to the value of the positive voltage rail $V^+$, which voltage is divided between the resistor values of R3 and R4 to effectively turn on transistor Q3. With Q3 turned on, its collector is shorted to the value of the negative voltage rail $V^-$, which effectively turns off transistor Q5 and renders control signal line 25 at the common collectors of transistors Q4 and Q5 in the high-impedance state. Thus, the voltage gain of the controller 30 is maintained to enable distortionless output audio signal.

The proximity detector of FIG. 2, senses the closeness of the speaker driver audio output signal 19 to the voltage power supply rails $V^+$, $V^-$, and controls the gain of the speaker drive signal as follows: When the audio passage, i.e., the speaker driver amplitude, is a maximum, the peak-to-peak audio signal amplitude will come close to the voltage supply rails. Specifically, at the point when the speaker driver signal attains an amplitude level such that the base to emitter voltage of Q1 and/or Q2, is less than a trigger level, i.e., its respective turn-on voltage, (e.g., 0.6 V), then transistors Q1 and/or Q2 will turn off, resulting in transistors Q4 and Q5 being turned on. Specifically, when the speaker driver signal amplitude comes within the trigger level (e.g., 0.6V) of the negative voltage rail $V^-$, transistor Q2 will turn off enabling positive voltage from $V^+$ through resistor R5 to turn on transistor Q4 and consequently, enabling current flow through resistor R6 at the common collectors of transistors Q4 and Q5. Thus, a decrease of the control signal voltage 25 will result. A decrease of the control signal voltage 25 acts to decrease the system gain as provided by voltage gain controller circuit 30. Similarly, when the speaker driver signal amplitude comes within the trigger level (e.g., 0.6V) of the positive voltage rail $V^+$, transistor Q1 will turn off, which will enable Q3 to turn off as the collector of Q1 is at high impedance. With Q3 turned off, positive voltage from $V^+$ through resistor R7 turns on transistor Q5 enabling current flow through resistor R6 at the common collectors of transistors Q4 and Q5 and, consequently, a decrease of the control signal voltage 25. A decrease in the system gain will bring the speaker driver signal outside of the trigger level so as to maintain the maximum distortionless speaker driver level without clipping the high amplitude passages of the audio signal.

Figure 3:
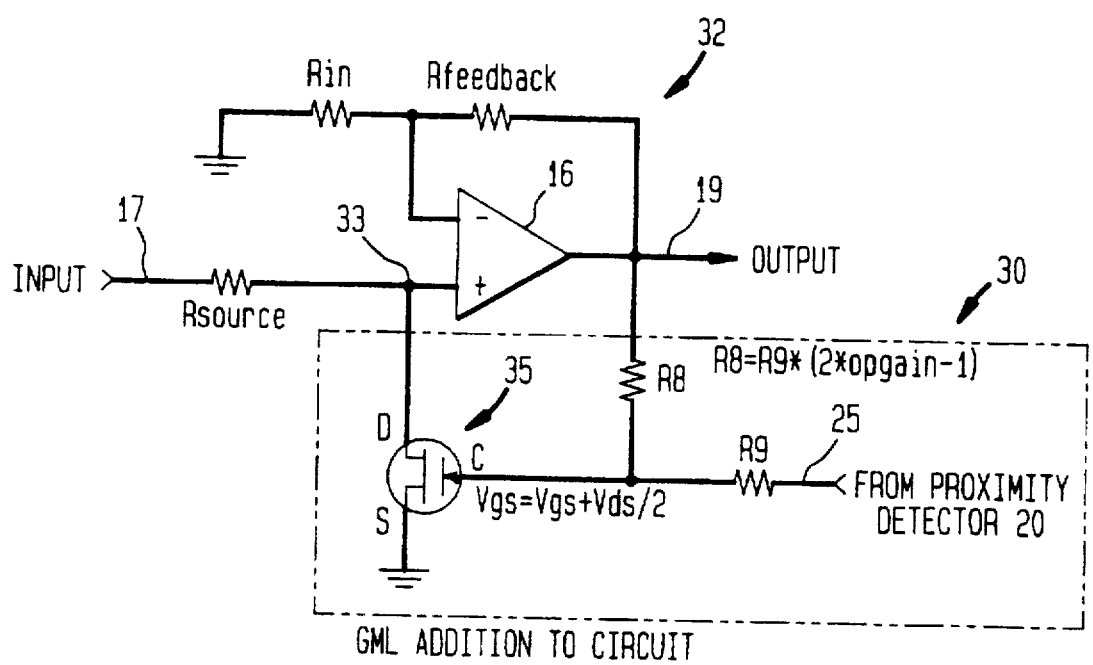
FIG. 3 illustrates a detailed circuit diagram of the voltage controlled gain circuit.

Although not necessary to the inventive concept, FIG. 3 illustrates a voltage controlled gain circuit 30 and amplifier circuit 32 comprising an amplifier 16 for providing dynamic gain to the audio signal. It should be understood to those skilled in the art that amplifier device 16 may consist of an operational amplifier, for e.g., and may be considered as a preamplifier for the speaker driver stage 15 (FIG. 1), or, that the amplifier 16 and amplifier circuit 32 may be designed to provide audio signal gain and speaker drive together. As the drive amplifier 15 provides gain that is voltage controlled, an FET circuit 35 is provided at a positive node input 33 of the operational amplifier 16 that functions as a voltage controlled variable resistance device. Particularly, the gate terminal of the FET 35 receives the control signal voltage 25 from the proximity detector 20 to vary the impedance of the drain to source channel region in accordance with the control signal voltage 25. However, as signal quality of the output voltage depends on the linearity of the channel impedance, the FET 35 is modified to provide a linear, gate modulated channel resistance.

Particularly, FIG. 3 illustrates a voltage controlled gain circuit 30 which includes an N-channel depletion mode JFET 35. By modulating the gate voltage with approximately one-half the value of the drain-to-source AC signal, provided to the gate as feedback from the operational amplifier 15 through divider resistors R8 and R9 in the manner as shown, the channel resistance of JFET 35 exhibits a perfectly linear channel resistance. For e.g., the voltage controlled gain circuit of FIG. 3 provides a 40 dB dynamic range, 0.1% THD voltage controlled gain function.

It should be understood that the preferred embodiments and examples described are for illustrative purposes only and are not to be construed as limiting the scope of the present invention which is properly delineated only in the appended claims.

I claim:

1. A distortion reduction system for an audio device having first and second power supply voltages, a driver circuit for amplifying an audio signal, and a speaker for outputting said amplified audio signal, said system comprising:

a) means for detecting a voltage difference between the instantaneous peak amplified audio signal value and each said first and second power supply voltage values, said voltage difference detecting means including a first switching means having a first terminal receiving said amplified audio signal, a second terminal connected to said first supply voltage, and, an output terminal, said voltage difference detecting means further including a second switching means having a first terminal receiving said amplified audio signal, a second terminal connected to said second supply voltage, and an output terminal, said first and second switching means providing a first switching signal at a respective output terminal when a detected difference at said first or second switching device is greater than said predetermined trigger voltage level and, said first and second switching means providing a second switching signal at their respective output terminal when a detected difference at said device is less than said predetermined trigger voltage level;

b) means responsive to said detected difference for providing a first gain control signal to said driver circuit when said detected difference is greater than a predetermined trigger level value, and a second gain control signal to said driver circuit when said detected voltage difference is less than said predetermined trigger level value, wherein said first and second gain control signals operate to maintain amplified peak-to-peak audio signal output values between power supply voltage limit values; and c) said driver circuit including an amplifier having an input for receiving said first gain control and second gain control signals, said first gain control signal enabling said amplifier to provide constant gain to said audio signal and said second gain control signal enabling voltage gain reduction of said amplifier.

2. A distortion reduction system according to claim 1, wherein said driver circuit further includes a voltage controlled impedance device for providing a variable resistance output in accordance with said first and second gain control signals, said variable resistance being provided at said amplifier input for controlling said amplifier gain.

3. A distortion reduction system according to claim 1, further including the step of inputting said first gain control and second gain control signals to said driver circuit for enabling said amplifier to provide a constant voltage gain to said audio signal in response to said first gain control signal and enabling voltage gain reduction of said amplifier in response to said second gain control signal.

4. A distortion reduction system according to claim 1, further including a third switching means including an input terminal for receiving said first and second switching signals, and an output terminal; and, a fourth switching means having a terminal for receiving said first and second switching signals, and an output terminal; both said third and fourth switching means providing said first gain control signal at their respective output terminals in response to receiving said first switching signal, and said third and fourth switching means providing said second gain control signal at their respective output terminals in response to receiving said second switching signal.

5. A distortion reduction system according to claim 1, wherein said first switching means includes a first bipolar junction transistor and said second switching means includes a second bipolar junction transistor, said predetermined trigger level being the $V_{be}$ turn-on voltage for said first and second transistors.

6. A distortion reduction system according to claim 5, wherein said predetermined trigger level is 0.6V or less.

7. A distortion reduction system according to claim 5, wherein said first power supply voltage is greater than 0V and said first switching device includes an PNP bipolar transistor.

8. A distortion reduction system according to claim 5, wherein said second power supply voltage is less than or equal to 0V and said second switching device includes an NPN bipolar transistor.

9. A distortion reduction system according to claim 4, wherein said third and fourth switching means includes third and fourth bipolar junction transistors, respectively, said first switching signal rendering said third and fourth bipolar junction transistor in an OFF state to provide said first gain control signal at an output terminal thereof, and said second switching signal rendering said third and fourth bipolar junction transistor in an ON state to provide said second gain control signal at said output terminal thereof.

10. A distortion reduction system according to claim 9, wherein said output terminals of said third and fourth bipolar junction transistors are coupled together to provide an input to said amplifier.

11. A distortion reduction system according to claim 9, wherein said first switching means includes a fifth transistor for receiving said first and second switching signals at said output terminal and processing said first and second switching signals to provide them to said third switching means at a same operating voltage as first and second switching signals output of said second switching means.

* * * * *